United States Patent [19]

Ladd, Jr.

[11] 4,336,549

[45] Jun. 22, 1982

[54] SCHOTTKY-BARRIER GATE GALLIUM ARSENIDE FIELD EFFECT DEVICES

[75] Inventor: Glenn O. Ladd, Jr., Agoura, Calif.

[73] Assignee: Hughes Aircraft Company, Culver City, Calif.

[21] Appl. No.: 172,325

[22] Filed: Jul. 25, 1980

Related U.S. Application Data

[60] Division of Ser. No. 879,651, Feb. 21, 1978, Pat. No. 4,265,934, which is a continuation of Ser. No. 640,124, Dec. 12, 1975, abandoned.

[51] Int. Cl.³ ............................................. H01L 29/48
[52] U.S. Cl. ...................................... 357/15; 357/22; 357/55; 357/61
[58] Field of Search ..................... 357/15, 22, 55, 61

[56] References Cited

U.S. PATENT DOCUMENTS 4,040,168  8/1977  Huang .................................. 357/15
4,106,044  8/1978  Yoshida et al. ...................... 357/55

*Primary Examiner*—Edward J. Wojciechowicz
*Attorney, Agent, or Firm*—Mary E. Lachman; W. H. MacAllister

[57] ABSTRACT

A Schottky-barrier gate gallium arsenide field effect structure is made using a self-aligned gate fabrication technique. The resulting device includes source and drain regions, which are parts of a conducting channel formed through ion implantation or epitaxial growth or a combination of the two. A gate is formed on the same channel by first etching a portion of the channel between the source and the drain regions to form a gate window which then receives a Schottky-barrier gate electrode.

6 Claims, 2 Drawing Figures

SCHOTTKY-BARRIER GATE GALLIUM ARSENIDE FIELD EFFECT DEVICES

This application is a division of application Ser. No. 879,651, filed Feb. 21, 1978, and issued as U.S. Pat. No. 4,265,934, which is a continuation of application Ser. No. 640,124, filed Dec. 12, 1975, now abandoned.

FIELD OF THE INVENTION

This invention relates to field effect devices and a process for making same. More specifically it relates to a novel gallium arsenide field effect transistor having a self-aligned Schottky-barrier gate and the novel process for making same.

BACKGROUND

Field effect transistors have been known for many years and have been used extensively in many applications requiring among other things high input impedance, low input capacitance, high radiation tolerance and bilateral symmetry. Gallium arsenide field effect transistors are preferred over their silicon counterparts in certain high frequency operations because of their low noise and high power capabilities. One of the difficulties in processing gallium arsenide field effect transistors has been in making a reliable insulator on a gallium arsenide substrate. This problem has been by-passed by using Schottky-barrier gates to replace the insulated gates.

One important electrical parameter of a field effect transistor is its transconductance. Transconductance is the change of drain current caused by a change in the gate voltage. The external transconductance of a field effect transistor is increased as the ohmic resistance between the source and gate of the transistor is reduced. Another important device parameter adversely affecting the power gain of a field effect transistor is the drain-to-gate capacitance. The drain-to-gate capacitance should be as low as possible since it serves as a reverse feedback path for the output signal, and thus tends to reduce the power gain of the device. Both source-to-gate resistance and drain-to-gate capacitance are directly related to the geometric distances between the three regions of the transistor. To reduce the source-to-gate resistance and thus increase the transistor's transconductance, it is necessary to reduce the physical distance between the two regions. However, as this distance decreases, so does the breakdown voltage between them and this can become a limiting factor in the operation of the transistor. Therefore, it is important to have a process that can produce devices having the distances between the different regions kept within close tolerances.

PRIOR ART

One well-known gallium arsenide Schottky-barrier gate field effect transistor is described by Mr. S. M. Sze in "Physics of Semiconductor Devices," John Wiley, 1969, at page 410. Such devices are often constructed by growing an N-type gallium arsenide epitaxial layer on a semi-insulating gallium arsenide substrate. The source, gate and drain regions are formed on the epitaxial layer. The Schottky-barrier gate is usually made out of aluminum and is 1 $\mu$m to 3 $\mu$m long. The distance between gate and source is approximately equal to the distance between gate and drain and is approximately equal to the gate length, that is about 1 $\mu$m. The source and drain ohmic contacts are usually made of silver-germanium or gold germanium alloys.

Other more recent prior art devices have eliminated the need to grow to epitaxial layer and instead make use of ion implantation to form the different transistor regions. U.S. Pat. No. 3,912,546, which is assigned to the present assignee, describes a process for the fabrication of a GaAs Schottky-barrier gate field effect transistor, wherein initially a Schottky gate is formed over a section of the field effect transistor channel, and thereafter the gate metal is exposed to a bombardment of protons with sufficient energy to penetrate the metal and enter the field effect transistor channel region, thereby determining the conductivity of the channel.

U.S. Pat. No. 3,914,784, which is also assigned to the present assignee, describes certain GaAs field effect transistors wherein the active regions of the devices are formed by implanting suitable ions directly into a semi-insulating substrate.

All above-mentioned prior art devices have satisfactory performance up to a certain frequency level. To achieve an even higher frequency performance for GaAs field effect transistors there is a need for device geometries, and reproducible processes for making them, wherein some device regions can be made closer to each other and wherein the conductivity and thickness of the device channel can be more effectively controlled.

THE INVENTION

The general purpose of this invention is to provide certain novel gallium arsenide field effect transistors and a novel fabrication process therefor wherein a conducting channel is formed on a surface of a semi-insulating gallium arsenide substrate and a portion of this channel is selectively removed to provide a shallow conducting channel region between the two relatively thicker regions of the channel. Ohmic contacts are formed on the two thicker regions of the channel and a rectifying barrier is formed with the contiguous portion of the shallow conducting region of the channel.

The shallow conducting channel, which becomes the gate region of the device, can be formed through a selective etching of the channel. The etch mask also defines the gate metal dimension and controls the size of the gate and its proximity to the source and drain regions formed on the two unetched portions of the conducting channel.

A controlled etching of the gate region leaves a thin conducting channel which has the desired thickness and doping profile for the desired transconductance of the device. The conductivity and thickness of the gate region, or the intrinsic channel as this gate region is often referred to, can easily be monitored and allowed to vary in accordance with the ultimate use of the structure.

Therefore, since the source-gate region is thicker and has a lower resistance than the channel region, the source resistance can be lowered without moving the gate closer to the source. This makes the structure capable of operating at higher frequencies and with a higher signal-to-noise ratio and higher drain-to-source breakdown voltage than its prior art counterparts. Lower device noise results from lowering the source resistance. Similarly, the drain region can be placed somewhat further from the gate region to reduce the output capacitance and further increase the power gain of the device. This variation, of course, can be made only for some structures where the bidirectionality of the device is not as important as the power gain.

Accordingly, it is an object of this invention to provide certain novel field effect transistors capable of operating at higher frequencies than their prior art counterparts.

Another object of this invention is to provide a process for the fabrication of a field effect transistor having low source resistance, thus a high transconductance.

Another object of this invention is to provide a process for the fabrication of a field effect device having a gate region perfectly aligned to the intrinsic channel region.

Another object of this invention is to provide a process for self-aligned gate fabrication of gallium arsenide Schottky-barrier gas field effect transistors.

Another object of this invention is to provide a process for making GaAs field effect structures where the thickness and conductance of the intrinsic channel of the structure is controlled through etching.

Another object of this invention is to provide a process for making GaAs field effect transistors with superior frequency response than their prior art counterparts. This is achieved by a combination of a self-aligned gate fabrication and a progressive etching of the intrinsic channel region of the devices.

These and other objects of the invention will become more fully apparent in the following description of the accompanying drawings.

DRAWINGS

DETAILED DESCRIPTION

Figure 1:
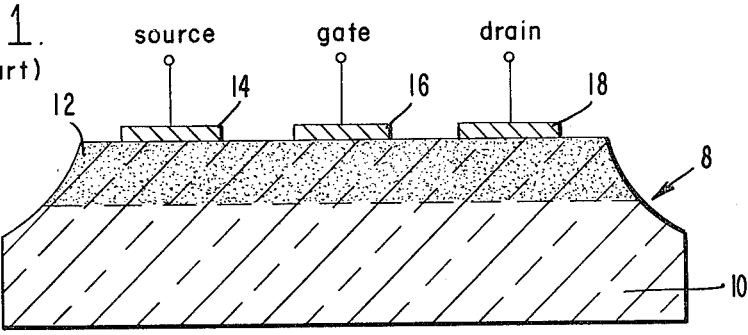
FIG. 1 is a diagrammatic cross-sectional view of a prior art Schottky-barrier gate field effect transistor.

Referring now to FIG. 1, there is shown one prior art gallium arsenide Schottky-barrier gate field effect transistor generally designated 8. The structure includes a semi-insulating gallium arsenide substrate 10, and an N-type gallium arsenide epitaxial layer 12. The device also includes on the epitaxial layer ohmic contacts 14 and 18 for the source and drain contacts, respectively, and a metal-semiconductor Schottky-barrier 16, for the gate of the transistor. Field effect transistors with this structure have a frequency cutoff point lower than that of the present invention. This is primarily due to the higher feedback resistance caused by the generally larger physical distances separating the source and gate regions. The self-aligned gate process introduced by the present invention makes possible the reproducible fabrication of field effect transistors with gate regions closer to the source regions and lower source-gate or feedback resistances.

Figure 2A:
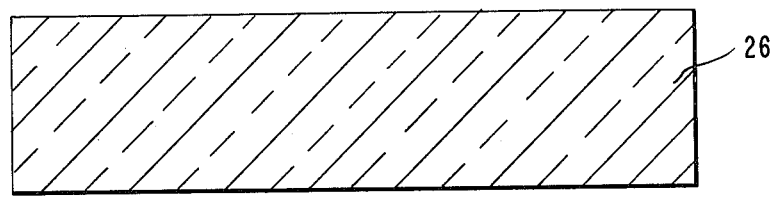
FIGS. 2a through 2f illustrate, in a series of schematic cross-sectional views, a sequence of some of the most important process steps utilized in fabricating a Schottky-barrier gate field effect transistor in accordance with the present invention.
Figure 2B:
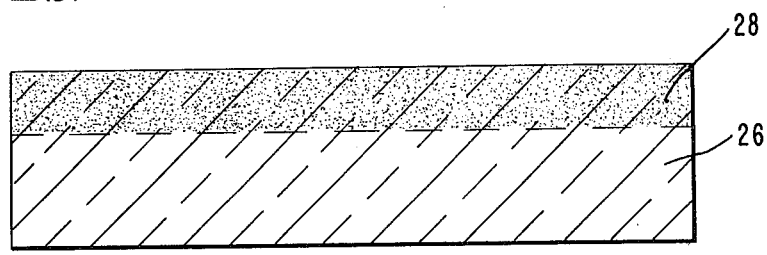

Referring now to FIG. 2, there is shown in FIG. 2a a substrate 26 of semi-insulating gallium arsenide material. It is a polished wafer doped with chromium (Cr) and having a <100> crystallographic orientation. Its resistivity is typically on the order of $10^6$–$10^8$ ohm-centimeters. On substrate 26 a conducting channel 28 is formed through ion implantation or epitaxial deposition or a combination of the two, that is, after forming an epitaxial layer, then the conductivity of that layer can be further increased by implanting it with suitable ions, such as sulphur. FIG. 2b illustrates a conducting channel 28, formed on substrate 26. If the choice is to form channel 28 through an epitaxial deposition, then on the chromium doped gallium arsenide substrate 26 an epitaxial layer 28 is formed, by either vapor phase or liquid phase epitaxy, to a thickness in the range of 0.3 μm to 1.0 μm and a carrier concentration of about $10^{17}$/cm$^3$. To maintain a good process yield it is preferred that the thickness of this layer be kept uniform to a degree consistent with the tolerance on device pinch-off voltage. Typically the required tolerance is between ±500 Å. The more uniform the thickness is, the more uniform the pinch-off voltage of the resulting devices will be. Local thickness variations, or hillocks, should be minimized to permit intimate contact of mask and wafer surface during subsequent contact photolithography. Such hillocks should not exceed a few tenths of 1 μm in height above the surrounding surface. The typical epitaxial layer is gallium arsenide; however, other semiconductor materials such as $In_xGa_{1-x}As$, with x being some hundredths to tenths, may be used for that purpose.

Alternatively, ion implantation may be used for the formation of the conducting channel 28. The chromium-doped, <100> crystallographically oriented GaAs substrate 26, may be implanted with sulphur. The extact dose/energy is determined by the desired device parameters. It may be varied to slightly adjust parameters of the device such as the variation of transconductance as a function of gate bias. For example, microwave sample devices have been built with a pinch-off voltage of a few volts, by implanting the substrate with $6 \times 10^{12}$ sulphur atoms/cm$^3$ at 140 kev, followed by a second ion implantation of $1.5 \times 10^{12}$ sulphur atoms/cm$^3$ at 50 kev. Following ion implantation the substrate surface is coated with a layer of SiO$_2$ that may be formed by pyrolysis of silane with oxygen at about 425° C. The SiO$_2$ layer prevents disassociation of the GaAs and out diffusion of the sulphur ions during a subsequent annealing step. Then the wafer must be annealed in a reducing ambient such as flowing forming gas (i.e. 90% N$_2$:10% H$_2$) for approximately 20 minutes at 800° C. This annealing step serves to electrically activate the implanted sulphur ions and to remove by annealing the lattice defects caused by implantation that would otherwise reduce the carrier mobility in the wafer. The SiO$_2$ layer is then removed using an HF etching solution. Depending on the doping parameters of the substrate, the resulting x-type doped layer exhibits a sheet resistivity in the neighborhood of 500 ohms per square and a Hall carrier mobility of about 3,500 cm$^2$/V-sec. The exact electrical parameters vary with the quality of the substrate, the implantation dose and energy, and the annealing time and temperature.

A third alternative would be to form the conducting channel by first forming an N-type epitaxial layer and then implanting it with sulphur ions or other suitable N-type ions at controlled doses and depths.

Figure 2C:
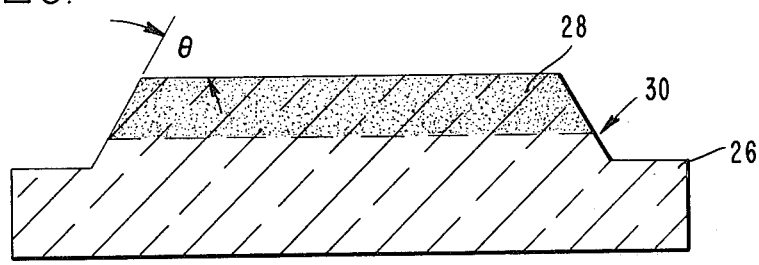
Figure 2D:
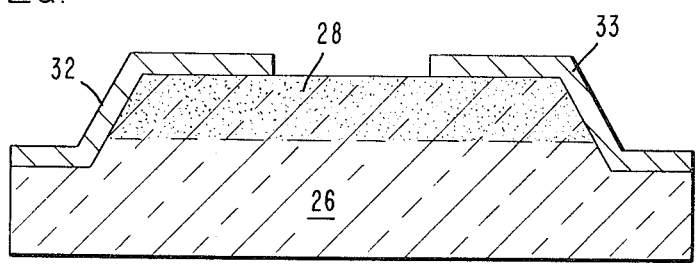

The next step is to form a photoresist mask on the top of the channel surface 28. The structure is then subjected to a suitable GaAs etchant, such as, for example, 73:22:5 parts per volume of H$_2$O:NH$_4$:30% H$_2$O$_2$, and this removes an annular outer portion of the channel region and part of the substrate under the channel, leaving a mesa-like island region 30 as shown in FIG. 2c. The mesa height is made 0.3 μm to 0.5 μm greater than the thickness of the doped channel in order to insure that parts of the etched surface exhibit properties characteristic of the underlying substrate. Although not indispensable for the performance of this device, the quality of the mesa step coverage by the metallization is improved if the step over which the gate pad connector is formed is oriented parallel to the <0$\bar{1}\bar{1}$> crystallographic orientation on the <100> surface. Thereby the orientation dependance of the common GaAs etchants is used to advantage in producing the smallest angle $\theta$. For the etching solution referred to above, this angle will be approximately 54°. After etching, the photoresist material is removed, and a second photoresist mask is formed on the exposed surface for the source and drain ohmic contacts. Using a standard retallization technique, appropriate ohmic contacts 32 and 33, as illustrated in FIG. 2d, are formed on the desired source and drain regions respectively. A suitable metallization is 1,000 Å of a Au-Ge eutectic alloy followed by 500 Å of Ni. The metal pattern produced is heated to about 450° C. for a time period ranging between 30 seconds and several minutes in order to produce an improved ohmic metal-semiconductor contact. The time-temperature cycle may be adjusted to yield the lowest contact resistance between the metal and the doped channel. It is desirable to keep this resistance below $5\times10^{-5}$ $\Omega$-cm$^2$. During the alloying cycle the metal tends to develop rectangular pits in the <100> surface with the longer sides in the <0$\bar{1}\bar{1}$> direction. These pits tend to grow most rapidly by propagation in that same <0$\bar{1}\bar{1}$> direction. Using the mesa orientation prescribed above, the orientation of these etch pits is such that their growth is constrained parallel to the edge of the source to drain opening and the edge acuity of this opening is preserved.

Figure 2E:
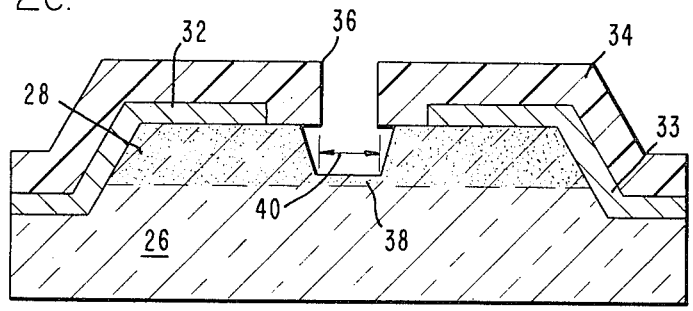

A new photoresist masking pattern 34 is formed on the structure as shown in FIG. 2e. The width of the opening 36 controls the length of the gate metal to be formed at a later stage. This width of opening 36 is typically in the range between 1 $\mu$m and 2 $\mu$m. The exposed portion of the channel 28, at 36, is etched to a predetermined depth using a wet chemical etch such as 970 mil H$_2$O:20 mil NH$_4$OH:7 mil 30% H$_2$O$_2$. The depth of the etched window is determined by the pinch-off voltage desired for the device. This provides a shallow N-type conducting channel 38 referred to as an intrinsic channel. When the doping of the channel layer is uniform, the intrinsic channel 38 thickness is related to the pinch-off voltage V$_p$ by $$V_p = (qNt^2/2k\epsilon_0) - \phi$$

where
q=electronic charge=$1.6\times10^{19}$
N=channel doping density in atoms/cm$^3$
t=thickness of the intrinsic channel 38 (in centimeters)
k=relative dielectric constant
$\epsilon_0$=permittivity of free space
$\phi$=barrier height of the gate metal-to-semiconductor contact
$\phi$=0.8 V to 0.9 V for most metals in GaAs.

Figure 2F:
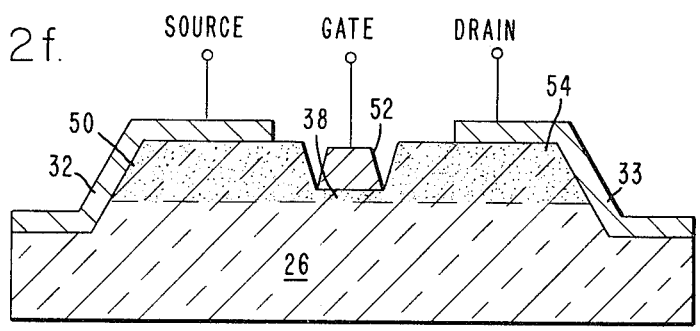

Achieving the proper depth of etch depends on an accurate knowledge of the initial channel layer thickness and the etch rate. The length 40 of the intrinsic channel 38 depends on the gate mask window 36 and again on the etch rate. It is usually somewhat greater than the gate mask window. Typically, if the gate opening 36 is 1 $\mu$m, then the length 40 of the intrinsic gate 38 is in the range of 1.1 $\mu$m to 1.5 $\mu$m. Without removing the photoresist material, a Schottky-barrier gate metal is formed through the evaporation of a metal on the intrinsic channel. Since the same mask is used for both, etching to form the intrinsic channel and for defining the gate metal length, the gate metal contact is constrained to the intrinsic channel area. The length of the gate is closely controlled and also its proximity to the source and gate regions is controlled. Aluminum is usually used to form the gate metal, but any other metal or combination of metals used for prior art Schottky gate field effect transistors may also be used with this invention. After the Schottky-barrier formation, the photoresist is dissolved and washed away, carrying the excess gate metal with it. Then conductors are attached to the metallic contacts of the source, gate and drain regions. The resulting structure is illustrated in FIG. 2f. Referring now to FIG. 2f, it contains source region 50, source ohmic contact 32, Schottky-barrier gate metal 52, intrinsic channel 38, a drain region 54 and drain ohmic contact 33.

By analogy a P-type Schottky-barrier gate field effect device may be constructed by using a P-type conducting channel.

While the invention has been described in connection with a preferred sequence of process steps to fabricate a basic field effect transistor structure, it will be understood that it is not intended to limit the invention to those process steps, their sequence, or the final structure depicted in the drawings. On the contrary, it is intended to cover all alternatives, modifications and equivalents, as may be included within the spirit and scope of the invention as defined by the appended claims. For example, various etchants can be used to control the channel geometry and thickness of the devices fabricated, and, if desired, the final device structure of FIG. 2f can be passivated using either sputter deposited SiO$_2$ or vapor deposited polycrystalline gallium arsenide (PGA).

What is claimed is:

1. A Schottky-barrier gate field effect transistor comprising:
   (a) a semi-insulating gallium arsenide substrate;
   (b) a conducting channel selectively formed on said substrate;
   (c) ohmic contacts formed on two chosen regions of the surface of said conducting channel to thereby form source and drain electrodes and define source and drain regions for said field effect transistor;
   (d) a relatively shallow conducting region of uniform thickness on said conducting channel, formed by selectively removing a predetermined portion of said conducting channel between said source and drain electrodes, to thereby form a trapezoidal shaped interval mesa cavity region in said conducting channel with the flat horizontal lower surface of said cavity region parallel to the interface between said substrate and said conducting channel, and angled side walls of said cavity region extending to said surface of said conducting channel at edges remote from said source and drain electrodes, and to thereby form the gate region for said Schottky-barrier gate field effect transistor; and
   (e) a thin strip of metallization located between said source and drain electrodes, primarily covering said flat horizontal lower surface of said trapezoidal shaped cavity region and with minimal contact with said side walls of said cavity region, and in intimate contact with said shallow conduction region, to thereby form a Schottky-barrier gate electrode for said field effect transistor that is remote from said source and drain electrodes, whereby voltages applied to said gate electrode are operative to control the conductivity of said shallow conducting region.

2. A Schottky-barrier gate field effect transistor capable of operating at relatively high frequency, with a relatively high signal-to-noise ratio, and with relatively high drain-to-source breakdown voltage, comprising:
 (a) a semi-insulating galliun arsenide substrate;
 (b) an active field effect transistor portion including, a source region, a drain region and an intrinsic channel, wherein said intrinsic channel is formed to be relatively thin with respect to said source region and said drain region by controlled etching of a conducting channel formed on said substrate, to provide a trapezoidal shaped inverted mesa cavity region in said conducting channel with the flat horizontal lower surface of said cavity region parallel to the interface between said substrate and said conducting channel and with angled side walls of said cavity region extending to the surface of said conducting channel;
 (c) ohmic contacts on said source and drain regions and remote from said angled side walls of said cavity region;
 (d) a Schottky-barrier gate electrode on said intrinsic channel, wherein said gate electrode contacts the majority of said flat horizontal lower surface of said cavity region, with minimal contact with said side walls of said cavity region, and is remote from said ohmic contacts on said source and drain regions.

3. A Schottky-barrier gate field effect transistor as set forth in claim 2 wherein said intrinsic channel has a thickness ranging between 500 Å and 3,000 Å.

4. A Schottky-barrier gate field effect transistor as set forth in claim 2 wherein said intrinsic channel and said gate electrode are formed closer to said source region than to said drain region to thereby reduce the output capacitance and increase the power gain of said field effect transistor.

5. A Schottky-barrier gate field effect transistor comprising:
 (a) a semi-insulating gallium arsenide substrate;
 (b) an active field effect transistor portion including adjoining source, drain and interconnecting channel regions, said field effect transistor portion meeting said substrate at a predetermined interface boundary, said channel region being of predetermined length and relatively narrow in thickness compared to said source and drain regions, said channel region having its upper surface spaced apart from said interface boundary by a preselected distance corresponding to a chosen device transconductance and operational frequency for said device; said predetermined length of said channel region being also selected to correspond to a desired source-to-gate capacitance and a desired gate-to-drain resistance for said device; and said channel region being formed by selective etching of a conducting channel layer formed on said substrate, to provide a trapezoidal shaped inverted mesa cavity region in said conducting channel layer;
 (c) ohmic contacts on said source and drain regions and remote from said cavity region;
 (d) a Schottky-barrier gate electrode on said interconnecting channel region, wherein said gate electrode contacts the majority of the flat horizontal lower surface of said cavity region, with minimal contact with the side walls of said cavity region, and is remote from said ohmic contacts on said source and drain regions.

6. A Schottky-barrier gate field effect transistor including an active device layer having a gate-contact-receiving cavity therein defined by a bottom wall from which angled side walls extend outwardly and upwardly to the top surface of said layer; said bottom wall defining the lateral extent of a channel portion of said transistor extending between a source and a drain within said active device layer and said channel portion being relatively thin with respect to said source and drain; source and drain ohmic contacts disposed respectively on said source and said drain of said transistor and remote from said side walls of said cavity; and a Schottky-gate contact substantially laterally coextensive with said bottom wall of said cavity and remote from said source and drain ohmic contacts, whereby gate-to-source and gate-to-drain interelectrode parasitic capacitances within said transistor are minimized.

* * * * *